United States Patent
Hicks (10) Patent No.: US 9,800,807 B2
(45) Date of Patent: Oct. 24, 2017

(54) IMAGE SENSOR OPERATION FOR SHUTTER MODULATION AND HIGH DYNAMIC RANGE

(71) Applicant: Intel Corporation, Santa Clara, CA (US)

(72) Inventor: Richmond Hicks, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 62 days.

(21) Appl. No.: 15/054,878

(22) Filed: Feb. 26, 2016

(65) Prior Publication Data

US 2017/0251151 A1 Aug. 31, 2017

(51) Int. Cl.
*H04N 5/355* (2011.01)
*H04N 5/353* (2011.01)
(Continued)

(52) U.S. Cl.
CPC ..... *H04N 5/3559* (2013.01); *H01L 27/14614* (2013.01); *H01L 27/14625* (2013.01);
(Continued)

(58) Field of Classification Search
CPC .... H04N 5/3559; H04N 5/3532; H04N 5/363; H04N 5/355; H04N 5/35509;
(Continued)

(56) References Cited

U.S. PATENT DOCUMENTS

| 6,307,195 B1 | 10/2001 | Guidash |
| 7,106,373 B1 * | 9/2006 | Dierickx ................. G01J 1/44 348/308 |

(Continued)

FOREIGN PATENT DOCUMENTS

JP 2001-186414 7/2001

OTHER PUBLICATIONS

Dirk Hertel, et al., "An adaptive multiple-reset CMOS wide dynamic range imager for automotive vision applications," 2008 IEEE Intelligent Vehicles Symposium, The Netherlands, Jun. 2008, 6 pages.

(Continued)

*Primary Examiner* — Albert Cutler
(74) *Attorney, Agent, or Firm* — Blakely, Sokoloff, Taylor & Zafman LLP (57) ABSTRACT

An image sensor is operated for shutter modulation and high dynamic range, suitable for use with a local lamp. In one example, charge is collected at a photodetector of a photodetector circuit for a first duration for a first mini-exposure. The photodetector charge is transferred to a charge collection node of the photodetector circuit. A portion of the transferred charge is spilled from the charge collection node. Charge is collected at the photodetector for a second duration for a second mini-exposure. The second mini-exposure photodetector charge is transferred to the charge collection node after spilling the portion. The collected charge is read after transferring the second mini-exposure photodetector charge and the spilled portion of the charge is estimated and the spilled portion is added to the collected charge reading to obtain a total charge value for the combined exposures.

20 Claims, 8 Drawing Sheets

(51) Int. Cl.
  *H04N 5/363* (2011.01)
  *H01L 27/146* (2006.01)
(52) U.S. Cl.
  CPC ..... *H01L 27/14643* (2013.01); *H04N 5/3532* (2013.01); *H04N 5/35527* (2013.01); *H04N 5/35572* (2013.01); *H04N 5/363* (2013.01)
(58) Field of Classification Search
  CPC .......... H04N 5/35527; H04N 5/35536; H04N 5/35572; H01L 27/14643; H01L 27/14625; H01L 27/14614
  See application file for complete search history.

(56) References Cited

U.S. PATENT DOCUMENTS

| | | | |
|---|---|---|---|
| 2005/0083421 A1* | 4/2005 | Berezin | H04N 3/155 348/308 |
| 2005/0167602 A1* | 8/2005 | Dierickx | G01J 1/44 250/370.01 |
| 2007/0002164 A1 | 1/2007 | Ward et al. | |
| 2008/0074524 A1* | 3/2008 | Panicacci | H01L 27/14609 348/308 |
| 2009/0101796 A1* | 4/2009 | Ladd | H04N 5/235 250/206 |
| 2009/0174799 A1* | 7/2009 | Lee | H04N 5/3594 348/294 |
| 2010/0002094 A1 | 1/2010 | Solhusvik et al. | |
| 2011/0303846 A1* | 12/2011 | Thorne | G01J 1/44 250/332 |
| 2012/0188423 A1 | 7/2012 | Solhusvik | |
| 2012/0235021 A1* | 9/2012 | Kasai | H04N 5/35527 250/208.1 |
| 2013/0181118 A1 | 7/2013 | Koizumi et al. | |
| 2014/0117206 A1* | 5/2014 | Park | H01L 27/14609 250/208.1 |
| 2015/0009375 A1 | 1/2015 | Agranov et al. | |
| 2015/0156387 A1 | 6/2015 | Miyakoshi | |
| 2016/0360074 A1 | 12/2016 | Winer et al. | |

OTHER PUBLICATIONS

PCT International Search Report and Written Opinion of the International Searching Authority for International Application No. PCT/US2017/013552, mailed Apr. 3, 2017, 9 pages.

* cited by examiner

*FIG. 9*

IMAGE SENSOR OPERATION FOR SHUTTER MODULATION AND HIGH DYNAMIC RANGE

FIELD

The present disclosure relates to the field of photodetectors for image sensors and in particular to a system and method with increased dynamic range and shutter modulation.

BACKGROUND

Digital camera modules continue to find more different types of platforms and uses. These include a wide variety of portable and wearable devices, including smart phones and tablets. These platforms also include many fixed and mobile installations for security, surveillance, medical diagnosis and scientific study. In all of these applications and more, new capabilities are being added to digital cameras. Significant effort has been applied to depth cameras as well as to iris and face recognition. A depth camera not only detects the appearance of the objects before it but also determines the distance to one or more of those objects from the camera.

There are several options for cameras to measure depth. There are passive systems that use multiple image sensors to determine the stereo offset between image sensors that are spaced apart from each other. Projectors are used in active systems to send coded light or structured light that is then analyzed by one or more image sensors. Structured light illuminates the scene with a specific pattern. The pattern is used to triangulate individually recognized projected features. Coded light projects a time varying pattern. Distortions in the pattern are used to infer depth. Other active systems use Time of Flight from a separate laser rangefinder or LIDAR as some examples. Active illumination is also used in various face, iris, and eye recognition systems.

Stereo imaging is easy to construct for consumer photography systems because it uses proven, safe, and inexpensive camera modules, but the stereo image is dependent on matching and comparing specific features in the scene. Clear sharp features are not always visible to the sensors, so active illumination is provided by a nearby LED (Light Emitting Diode) or other type of projector. This works well when the scene is not too bright, such as indoors or at night. In scenes with bright ambient light such as bright sunshine the active illumination may be overwhelmed by the ambient light.

To enhance the effectiveness of the active illumination, the pixels of the image sensors are operated in a way to improve their sunlight rejection of the camera. Pixel circuits have switches and capacitors that are operated to accumulate electrons generated by a photodetector in response to incoming light. The switches can also be used as a shutter to control the time at which an image is captured and the total amount of collected light at each pixel.

BRIEF DESCRIPTION OF THE DRAWING FIGURES

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity.

DETAILED DESCRIPTION

As described herein, the switches and capacitors of a CMOS (Complementary Metal Oxide Semiconductor) image sensor architecture and pixel may be operated to provide HDR (High Dynamic Range) and shutter modulation together with sunlight rejection for 3D imaging. In some embodiments, the dynamic range is extended by concurrently spilling charge from the pixel storage node while collecting charge in the photodiode. In some embodiments an FD (Floating Diffusion) reset gate is used to perform partial charge spilling and to control the dynamic range by means of controlling the amount and timing of the charge spill.

When using active illumination, the dynamic range of the image sensor pixels may affect the ability of the image sensors to determine depth. The projector is used to illuminate objects that are both near and far from the image sensor. A low power laser is safer and illuminates near objects but may be insufficient to illuminate far objects. On the other hand if the laser power is high enough for far objects, then near objects may be so well illuminated that feature details are washed out. These differences are explained in part by the projector power received at the camera falling off at the 4th power. These differences are explained, in part, by the limited dynamic range of the image sensor.

To provide a higher dynamic range, some systems capture multiple frames at different exposure times and then combine the light and dark frames in post processing to obtain a high dynamic range. However, since the frames are captured at slightly different times, objects or the camera itself may move between the frames. This causes ghosting, which can interfere with depth determinations. The approach described herein provides an extended dynamic range without multi-frame ghosting effects and without sacrificing shutter modulation features.

Sunlight provides a further obstacle to active illumination because it can overwhelm the active illumination. To reject sunlight, the pixels can be controlled so that they effectively collect charge only when the active illumination is enabled. This reduces the total effect of sunlight but results are still limited when part of the scene is brightly lit with sunlight and the remainder of the scene is in shadow.

In some scenes, such as when a vehicle enters or exits a tunnel, or where a pedestrian is standing behind an oncoming vehicle with active headlights, part of the scene can be very bright while other areas of the scene can be very dark. This means that some pixels in the camera are saturated at a given exposure setting while other pixels are not collecting sufficient signal. Naturally occurring scenes may have up to 1000 times more range in illumination than can be handled by a traditional CMOS image sensor. This can be accommodated in photography applications using techniques such as multi-frame High Dynamic Range, or charge spilling techniques that cause the sensor to have a non-linear response. Unfortunately, none of these techniques are compatible with the pixel control needed to synchronize the pixel exposure to a time modulated active illuminator for the purposes of improving performance in direct sunlight.

Figure 1:
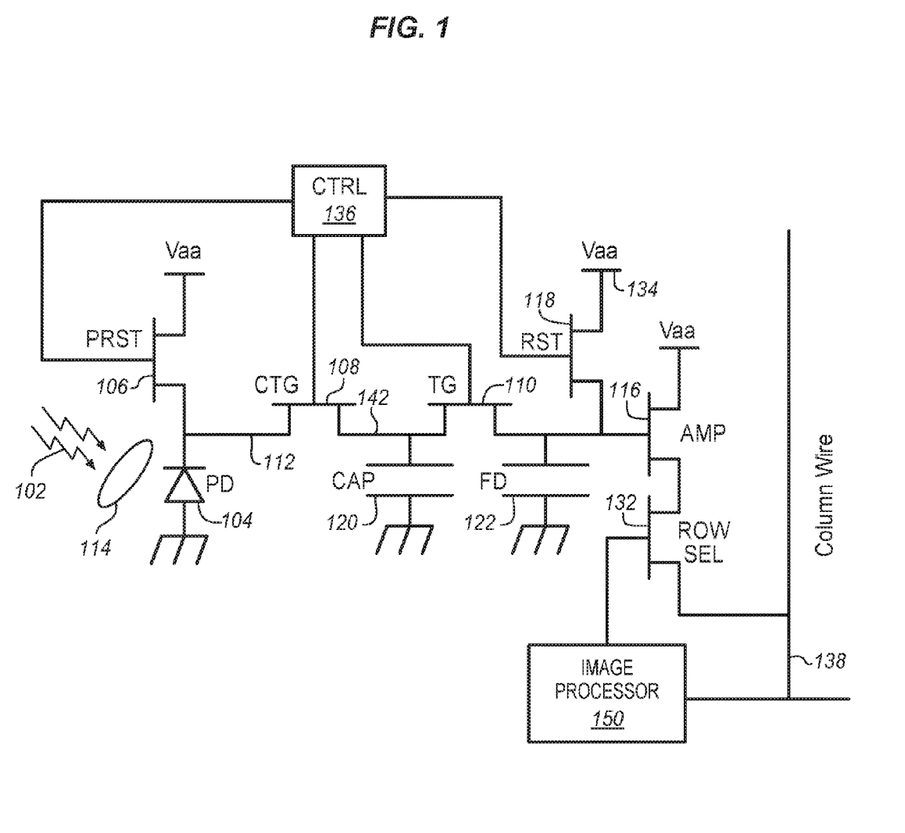
FIG. 1 is a circuit for a pixel within an image sensor according to an embodiment.

FIG. 1 is a diagram of a photodetector circuit for a single pixel with a sensor, circuitry, and other components, suitable for use with shutter modulation and HDR techniques. Light 102 from a scene impinges upon a photodetector element (PD) 104, such as a photodiode, although other types of photodetectors may be used instead, depending on the particular implementation. The top electrode is coupled to a photodiode reset transistor (PRST) 106 which is used to clear accumulated charge from the photodetector, and the bottom electrode is coupled to ground (GND). The light interacts with the photodiode to produce free electrons in proportion to the number of photons that impinge on the photodetector.

The array may include a lens 114 for one or more photodetectors that may be used to focus optical energy onto the photosensitive area of the photodetector. The lens may also include a color filter for infrared, red, green, or blue light. There may be additional filters, such as anti-aliasing filters, ultraviolet filters, etc. While only one photodetector is shown, there may be many more to create an image sensor or another type of sensor for any of a variety of different uses. There may also be additional components, such as additional optical elements, exposure controls, protective covers, electrical components, etc.

The output of the photodetector is coupled to a circuit for measuring the charge produced by the detector. This circuitry may be beside the photodetector as shown or some or all of the circuitry may be beneath or behind the photodetector so that the circuitry does not interfere with the operation of neighboring photodetectors.

The photodetector circuit has the photodiode (PD) 104, a photodiode reset transistor (PRST) 106, a charge transfer gate transistor (CTG) 108, a transfer gate transistor (TG), an accumulation unit in the form of a capacitor (CAP) 120, a floating diffusion region (FD) 122, a reset transistor (RST) 112, an amplifier transistor (AMP) 116, and a selection transistor (SEL) 132.

The photodiode reset transistor (PRST) is coupled between the cathode of the photodetector and the voltage supply (Vaa) 134 to discharge any charge accumulated in the photodiode (PD). The charge of the photodiode (PD) is discharged when the transistor is turned ON to connect the cathode of the photodetector (PD) to the HI terminal of the voltage (Vaa). This switch is operated by the controller 136 to reset the photodiode before each photon collection cycle. The reset reduces noise and other stray electrons in the photodetector.

The charge transfer transistor (CTG) 108 is connected between the cathode of the photodetector and the accumulation unit (CAP) 120 which is a capacitor area of the CMOS structure. This transistor is opened by the controller 136 to transfer the charge accumulated in the photodiode (PD) to the accumulation unit (CAP). The transfer transistor (TG) 110 is coupled between the (CAP) and the floating diffusion area (FD) 122 to transfer charge from the CAP to the FD when open.

The reset transistor (RST) configures a reset gate by opening and closing based on a reset signal from the controller 136 and discharges all charge in the floating diffusion (FD) when turned ON. When turned ON together with the transfer transistor (TG) and the charge transfer transistor (CTG), the reset transistor (RST) discharges the charge accumulated in the floating diffusion (FD), the unit capacitor (CAP), and the charge accumulated in the photodiode (PD) to reset the entire circuit. This allows the system to purge all noise and residual electrons before a collection cycle.

A further transistor is used as an amplifier (AMP) 116. The voltage on the FD 122 is applied to the gate of the AMP which serves as a low impedance voltage source based on the voltage at the FD node and provides this as a pixel signal through a selection transistor (SEL) 132. The SEL acts as a row select switch based on a signal from an image processor 150 or other controller. The SEL is coupled to the column line 138 to provide the pixel value when the row and column are selected.

The measuring circuit has two storage elements 120, 122 (CAP, FD) in parallel. These are shown as capacitors, however, they may also be any other suitable circuitry that stores a charge. The storage elements are coupled on one side to a common 140 or ground potential and on the other side to an output line 142 that is connected to the photodetector output 112. In use, the PD is reset and then operated in a set of short exposures. The charge is transferred to the CAP after each short exposure. The charge is collected until the end of the cycle after which the charge is transferred to the FD. The FD provides the final accumulated result to the image processor through the AMP and the SEL.

This operation with multiple short exposures is referred to as shutter modulation. It is used in some cases to coordinate with a pulsed infrared projector. The pulsed projector allows an infrared light with higher peak power to be used without causing damage to objects in front of the light potentially including eyes. The brighter light is better able to overcome ambient light in the scene. It may also be used to reduce noise and enhance dynamic range. The particular operation may be modified to suit different types of imaging and different environments.

Figure 2:
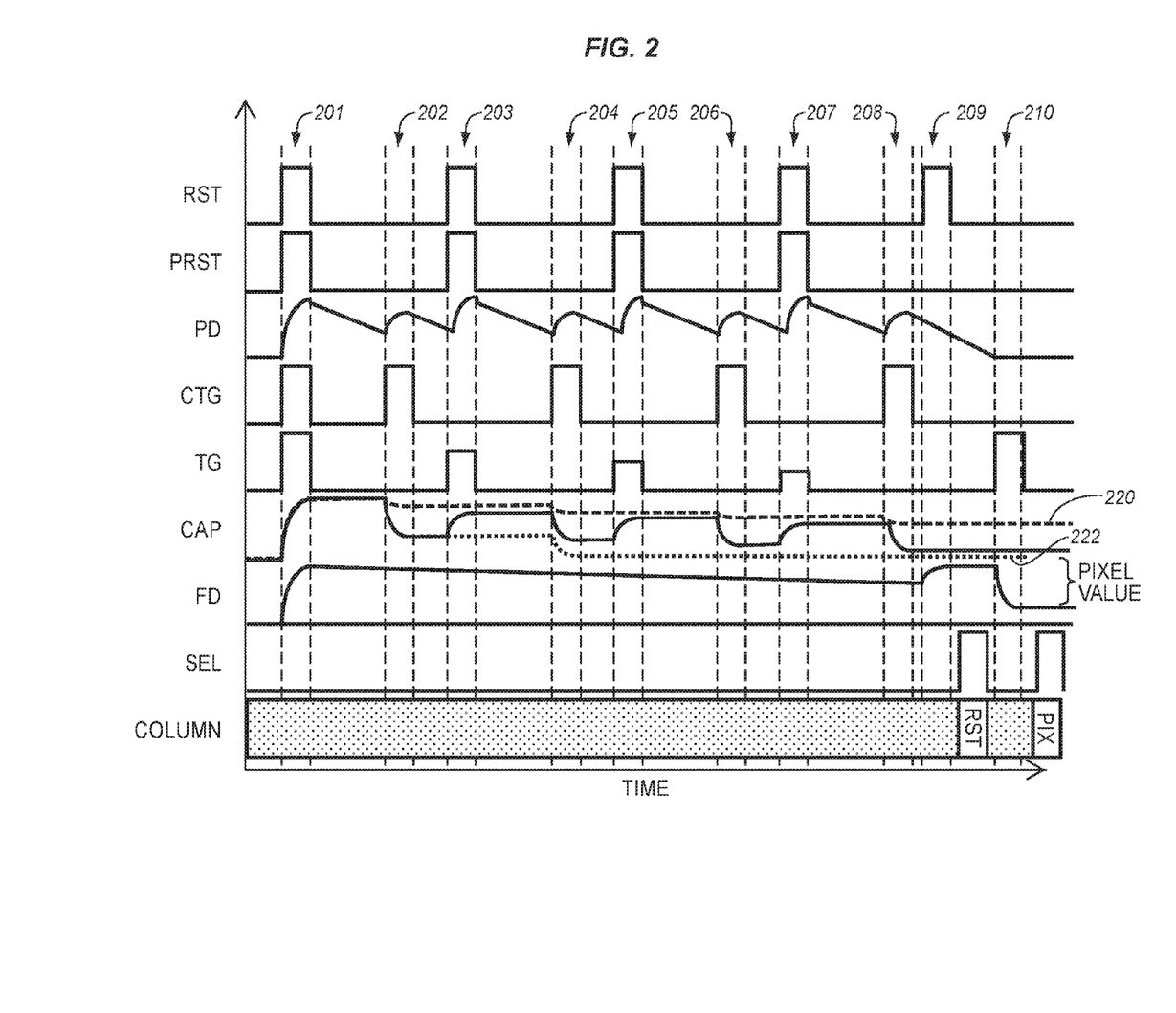
FIG. 2 is a timing diagram of a process of operating the circuit of FIG. 1 according to an embodiment.

FIG. 2 is a timing diagram to show operating the circuit of FIG. 1 as an HDR capture sensor using shutter modulation. Time is shown from left to right across the horizontal axis and signal amplitude is shown for each of the components on the vertical axis. The time is aligned for each component of FIG. 1. Events are indicated by reference numbers at the top of the diagram.

At time 201, the PD, CAP and FD are all reset. This is done by switching RST, PRST, CTG, and TG to HI while SEL is LO. Note that if operated in a fully depleted mode, PD will drop to the pin voltage after it is released between time 201 and time 202. CAP still has kTC noise unless it is built as a fully depleted PN junction or using some other special structure. The "kTC" noise is due to thermionic emission across the potential barrier of the TG. This noise is present even after reset and therefore is the primary noise source in low light conditions.

At time 202, the first mini-exposure is ended. CTG is opened and charge is transferred from the PD to the CAP.

At time 203, the second mini-exposure begins. RST and PRST are opened to reset the PD and the FD. CTG remains closed to isolate PD from CAP. The controller 136 places a voltage on the TG gate to perform a partial reset through RST which is open. This drains most, but not all of the charge from any CAP which has accumulated a large charge. Any dim pixels that have not accumulated a large charge (gray line) are not affected. As shown, the height or voltage of the drive signal from the controller 136 to TG is lower than for the first reset at 201. This lower voltage at TG means that the reset of CAP is partial.

At time 204, the second mini-exposure ends. CTG is opened and the new additional charge of the PD is transferred to the CAP adding to the previously stored charge. TG remains closed. Since the CAP was partially drained at time 203, CAP does not overflow and there is sufficient capacity to receive all of the charge from PD. Note that without the partial reset at time 203, the charge storage capacity of the CAP would have overflowed as shown in the dashed line 220 and any charge accumulated by subsequent mini-exposures would be lost.

At time 205 the third mini-exposure begins. RST, PRST, and TG are opened again to reset PD and partially reset CAP as at time 203. The partial reset on TG has an even lower height than at 203. As shown, the charge on CAP is larger than after the second mini-exposure so that any dim pixels indicated by the dotted line remain unaffected. The charge value for dim pixels is shown by the dotted line 222.

At time 206, the third mini-exposure ends and so charge is again transferred from the PD to the CAP adding to the existing charge.

At time 207 a fourth mini-exposure begins. This is handled just like the beginning of the first, second and third mini-exposures. The PD is reset, and the CAP is partially reset with a still lower pulse leaving even more charge so dim pixel values at the dotted line value 222 remain unaffected.

At time 208, the fourth mini-exposure ends. This is the last mini-exposure in this example. There may be more or fewer mini-exposures, depending on the particular implementation. The mini-exposures may be coordinated with the projector or other illumination source and the number and duration of each mini-exposure may be modified to suit different purposes. At time 208, CTG is switched on and charge is transferred to the CAP adding to the previously stored charge.

At time 209, RST is switched on while PRST remains off. As a result, the FD node is reset, eliminating any accumulated leakage charge or other effects. RST is switched off and then SEL is switched on to read out the value of FD after the rest is finished. The reset includes kTC noise and any other residual charge.

At time 210, TG is switched on at the full height or voltage while the other switches are off. The full remaining charge is therefore transferred from CAP to FD. After this TG is switched off and SEL is switched on so that the resulting voltage is read out as a signal. The pixel value may be taken as the difference between this value of FD and the value after time 208. This difference value is then used for CDS. Control of the gate voltage on TG for the partial resets enables extrapolation of the final pixel value to the total number of photons that struck the photodetector over the multiple mini-exposures.

The shutter modulation using multiple mini-exposures as described above is particularly suitable for use with active illumination. Using multiple short exposures that are synchronized with a lamp or projector allows the reflected light from the lamp or projector to be received at the photodetector at higher levels relative to the ambient light, such as sunlight. This is useful when the system wants to control the lighting either because the lamp projects a pattern that is being used by the system or because the system is analyzing the scene using the light from the lamp not the ambient light. A projected pattern may be important for structured light, coded light, and active stereo, for example. Other systems have algorithms that analyze shading or some other characteristic of the scene independent of the ambient light, such as face login and iris scanning.

In the example of FIG. 2, the lamp or projector may be activated for each mini-exposure so that light from the lamp and reflected from the scene impinges on PD. FIG. 2 has four mini-exposures, one after each PRST pulse and lasting until the next CTG pulse. The lamp or projector may be illuminated immediately before or at the same time as the PRST pulse and then de-activated immediately before or at the same time as the CTG pulse. The length of time between the PRST and CTG pulse may be modified to suit the characteristics of the lamp or projector and the information desired using the lamp or projector. There may be more or fewer mini-exposures to allow full use of the lamp or projector.

Figure 3:
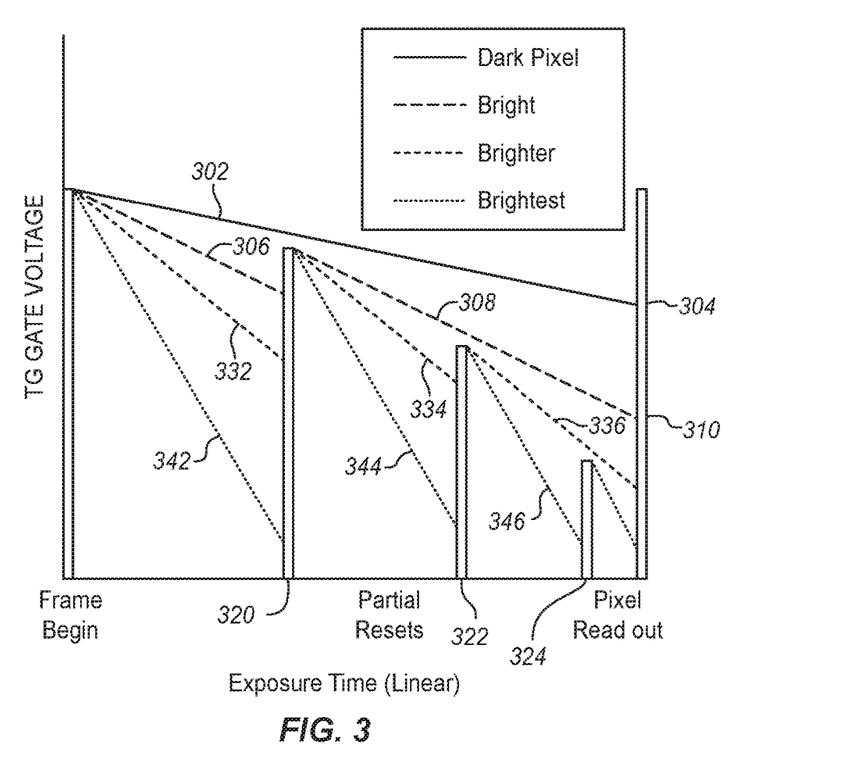
FIG. 3 is a graph of the transfer gate voltage over time for different amounts of scene brightness in the process of FIG. 2 according to an embodiment.

FIG. 3 is a graph of the gate voltage of TG on the vertical axis and exposure time on the horizontal axis for pixels receiving four different levels of scene brightness. There are three sequential partial resets 320, 322, 324 followed by a pixel readout. Each partial reset has a decreased voltage applied to the TG gate 110 of FIG. 1 during the exposure period to extend the dynamic range. The different diagonal lines 302, 306, 332, 342 show the voltage at the photodetector over time. The rate of discharge of the photodetector increases with light intensity. The lower dotted line 342, 344, 346 represents the response of a relatively dark pixel, while the other lines represent the responses of increasingly brighter pixels. As the pixels become brighter a complete discharge would saturate the photodetector before the end of the exposure time. In the bright pixels where the photodiode voltage has been discharged below the partial reset voltage, the capacitance will be recharged.

Depending on the brightness, more than one partial reset might be necessary to avoid saturation. In the illustrated example, one discharge is sufficient for the darkest pixel line 302. Notice that the darkest pixel indicated by the solid line 302 is unaffected by the partial resets, because the partial resets 320, 322, 324 have a height that is less than the dark or dim pixel 302. One discharge 320 is used to prevent the upper dashed line 306, 308 from saturating. Two discharges 320, 322 are necessary to prevent the lower dashed line 332, 334, 336 from saturating and all three discharges are required to prevent the bottom dotted line, corresponding to a bright scene 342, 344, 346 from saturating.

The partial resets extend the dynamic range and generate a piecewise linear approximation to an ideal response curve that detects dark detail in linear mode and compresses highlights in the non-linear dynamic range extension. By adjusting the number, height, and timing of the partial resets or barriers, the response curve can be adapted in real time to cover the entire intra-scene dynamic range while keeping the incremental SNR (Signal to Noise Ratio) above a minimum threshold at all times.

Viewed another way, the four pixel brightnesses of FIG. 3 show the impact on the charge/voltage stored on the CAP node. In the example of a darkly illuminated pixel 302, the voltage 304 at the CAP node remains below the voltages applied at the gate of the TG and therefore no charge is spilled. The maximum pixel signal for which this is true can be determined by drawing a line between the original reset voltage and the first TG voltage used to partially reset the pixel. All brighter pixels will be partially reset by the first TG, and this becomes the reference for all brighter pixels.

A brighter pixel 306, 308 is impacted by the first partial reset 320, but not by the remaining partial resets 322, 324 because the CAP voltage 310 is lower than the gate voltage applied during the first partial reset 320. Brighter pixels are impacted by the additional partial resets as shown by the TG gate voltage for a brighter scene 332, 334, 336 and by the TG gate voltage for a brightest scene 342, 344, 346. Each partial reset forms a new reference point for any signals bright enough to have exceeded the TG voltage used to apply the partial reset.

Figure 4:
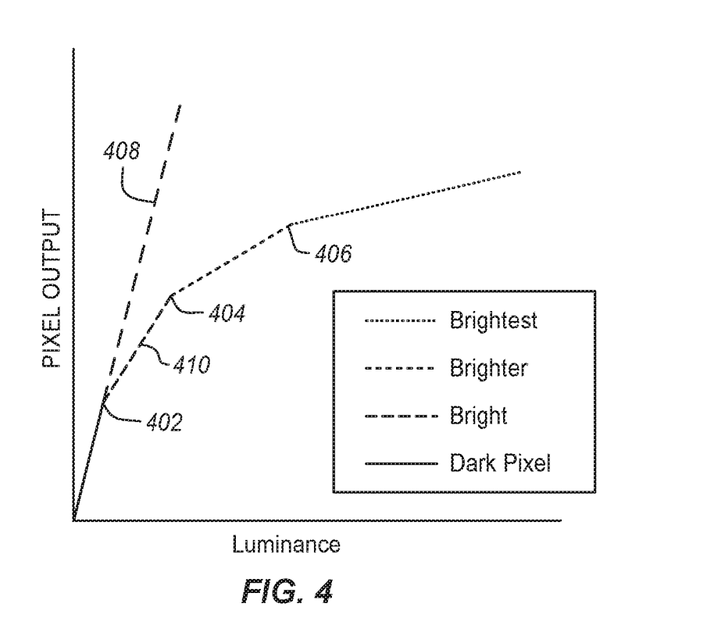
FIG. 4 is a graph of the pixel output versus scene brightness in the process of FIG. 2 according to an embodiment.

The impact on the pixel response is shown in FIG. 4 which is a graph of pixel output value on the vertical axis as a function of luminance on the horizontal axis. The straight line 408 closest to the vertical axis shows the charge collected without partial resets. This line continues upward on the pixel output scale to exceed the capacity of the storage node. The second jointed line shows the pixel output with the partial resets. As shown the actual output line branches off after the first partial reset. Each of the partial resets corresponds to an inflection point 402, 404, 406 of the output response. The timing and amplitude of the partial resets control the location of and resulting slopes after near these inflection points. The result is a piecewise linear response with a unique mapping of pixel output values to input illumination values.

The pixel output response is the reciprocal of a line connecting the full and partial reset voltages. By controlling the timing and amplitude of the partial resets, any output with monotonically decreasing output response can be achieved. In some embodiments, the inflection points are set to optimize the SNR of the pixel output including effects such as the quantization noise.

Figure 5:
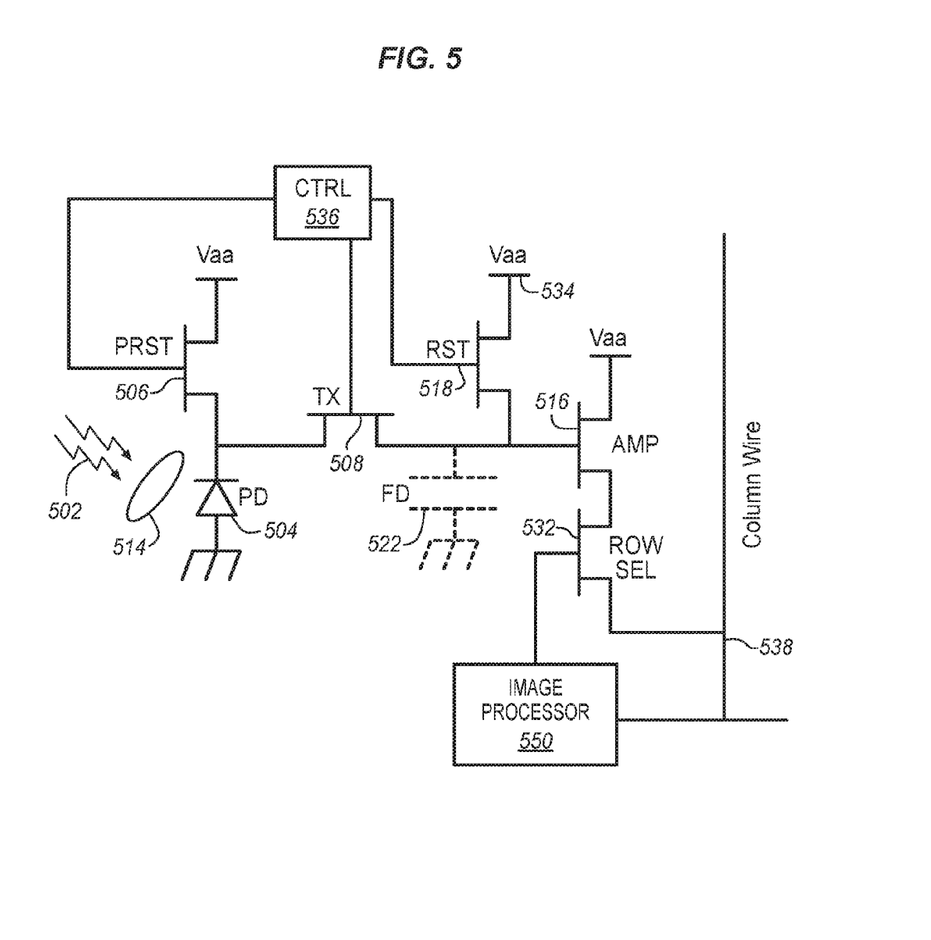
FIG. 5 is an alternative circuit for a pixel within an image sensor according to an embodiment.

FIG. 5 is a circuit diagram of an alternative configuration of a photodetector or pixel circuit. Incident light 502 is focused, filtered, and otherwise processed by an optical system 514 and then strikes a photodiode (PD) 504. PD is coupled through a shutter control switch (SG) 506 across a positive power supply voltage (Vaa) 534 and a ground terminal. PD generates a charge in the form of free electrons in response to the impinging photons 502 that depends on the intensity of the impinging light and the exposure duration. While a photodiode is shown, any other type of photodetector circuit may be used. The circuit may be adapted accordingly, while still using the principles of operation described herein.

PD is coupled across a transfer gate (TX) 508 to a floating diffusion area (FD) 522. Charge produced by the photodetector is transferred to FD wherein it is accumulated when TX is opened. A reset control signal is applied from a controller 536 to a reset switch (RST) 518 to reset the charge storage node FD 28 to Vaa. The reset switch is coupled between FD and Vaa. There may be additional charge storage regions in the circuit. FIG. 1 shows two charge storage regions for example. An intermediate memory node such as a diffused diode and intermediate transfer gate or any other suitable in-pixel memory configuration may be located between TX and the connected source follower amplifier transistor 516.

To read the accumulated charge at FD one side of FD is coupled to an amplifier (AMP) 516. The FD voltage from the accumulated charge is amplified and applied to a row select switch (RS) 532 that connects to a column wire 538. An image processor 550 is coupled to the RS and column wires to collect the readings from the pixels of the image sensor array.

The shutter gate (SG) 506 is also controlled by the controller 536 which may be the same as or connected to the image processor 550. The controller may also be a separate independent structure. Asserting a shutter control signal to open SG resets PD to the power supply voltage Vaa. When SG is off or de-asserted, then PD accumulates photo-generated charge.

As with the example of FIG. 1, the circuit diagram shows only a single pixel or photodetector circuit. An image sensor will have many rows and columns of pixels. These are accessed through coordinated operation of the column line with RS. All of the image data is collected through these lines by the image processor or any other processing circuitry to be converted into a desired type of image.

Figure 6:
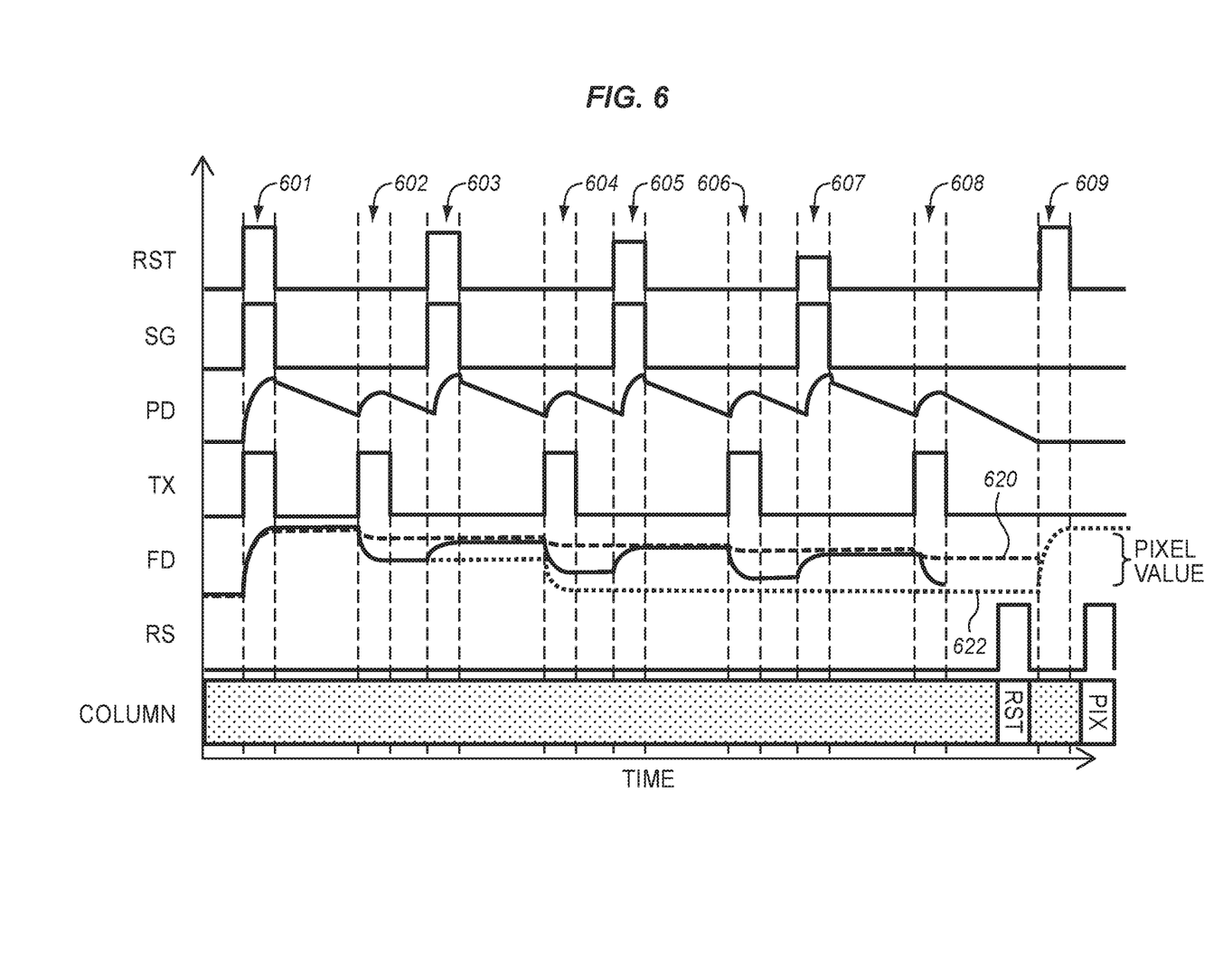
FIG. 6 is a timing diagram of a process of operating the circuit of FIG. 5 according to an embodiment.

The shutter gate (SG), transfer gate (TX), and reset gate (RST) are controlled by the controller 536 to generate the signals shown in the timing diagram of FIG. 6. As with the diagram of FIG. 1, the circuit may be operated in other modes to create different results and support different functions. As shown, SG is pulsed dynamically during a frame capture to produce mini-exposures. Each cycle of dynamic shutter operation includes a period of time when the shutter is open and when the shutter is closed.

FIG. 6 shows signals at different nodes of the circuit on the vertical axis versus time on the horizontal axis. This operation of the circuit allows for HDR operation with a modulated shutter.

At time 601, all of the switches RST, SG, TX are opened by the controller 536. As a result, PD and FD are reset. In this example, PD may drop to the pin voltage when released if it is operated in a fully depleted mode. FD will not be reset to Vaa but will have kTC noise already accumulating. After the reset, all of the switches are closed including SG so that the photodetector PD accumulates charge.

At time 602, the first mini-exposure ends. All of charge from PD is transferred to FD by opening TX. PD is emptied.

At time 603, the second mini-exposure begins. PD is reset by opening SG. After TX is closed FD is partially reset by RST. This spills some of the accumulated charge. At 603 a voltage lower than the standard reset voltage at 601 is applied to RST to spill some of the charge in FD.

At time 604, the second mini-exposure ends. TX is opened and charge is transferred from PD to FD adding to the previously stored charge. As shown in this example, the node FD is not completely filled because of the partial reset at 603.

At time 605, SG opens to reset PD and then closes to begin the third mini-exposure. PD is reset, and a partial reset is applied to FD through RST. As shown a still lower voltage is applied to RST for this second partial reset. Some charge is then spilled from FD before the start of the third mini-exposure. Accordingly, the height of the RST pulse at 605 is lower than the pulse at 603.

At time 606, the third mini-exposure ends. TX opens to fully transfer the accumulated charge from PD to FD which does not overflow again due to the partial reset of FD at 605.

At time 607, the fourth mini-exposure begins by resetting PD and another partial reset of FD through a still lower voltage applied to RST.

At time 608, the fourth mini-exposure ends. The PD is again emptied into FD through TX. FD again does not overflow due to the prior partial reset.

At time 609, FD node is read to determine the pixel signal. This signal is proportional to the final partial reset and to the charge accumulated in the last mini-exposure.

At time 610, the FD node is reset and read again to determine a baseline null value for a pseudo correlated double sampling of FD. The actual pixel reading is the difference between the 609 reading and the 610 reading. This difference is then extrapolated to determine a value for the total illumination that impinged on PD during all of the mini-exposures. kTC noise remains in the value and can be estimated and subtracted or it can be ignored because it is small after all of the collected electrons from all of the mini-exposures.

As in FIG. 2, the dashed line 620 represents a scene that is very dim at the location of the pixel, such as in line 302 of FIG. 3. This dim value is not affected by the charge spilling and increases very slightly after each mini-exposure. The dotted line 622 in the drawing shows the behavior of a bright pixel that is not partially reset, illustrating the charge overflow and loss of information that would occur without the charge spilling described herein.

In both of these examples a controlled amount of stored charge is spilled from the collection node after each mini-exposure. This increases the amount of charge that can be collected from the photodetector. The increase in the amount of charge increases the maximum brightness that can be measured for each pixel without increasing the total capacity of the collection node. The result is an increased dynamic range for each pixel and a better ability to discern features when brightly lit with a projector or other illumination. The controlled nature of spilling the excess charge allows the total amount of charge to be estimated.

The total amount of charge can be estimated using the output value and comparing it to a known response curve. As shown in FIG. 4, a particular photodetector and circuit will have a response curve based on the total number of photons and the timing and amplitude of the partial resets. The response curves may be pre-determined using empirical results. These curves may then be used to map the value of the pixel readout to the appropriate response curve. The corresponding response curve pixel value may then be used for the total pixel value. Different operational modes may use different partial reset timing and amplitudes. Each of these operational modes may then use an appropriate response curve for how the pixel circuit is operated. The response curves may be applied in the controller 136, 536, in the image processor 150, 550 or in other downstream processing.

As with FIG. 2, the operation of FIG. 6 is also well suited for sunlight or other ambient light rejection when active illumination is used. The four mini-exposures occur after the RST pulse and before the TX pulse. When a lamp or projector is used for active illumination it is activated immediately before the end of the RST pulse and deactivated immediately before or at the same time as the TX pulse. For some purposes, a scene with active illumination may be compared to one without the active illumination. For such a purpose, there may be a separate exposure with a corresponding set of mini-exposure for which the lamp or projector is not illuminated.

Figure 7:
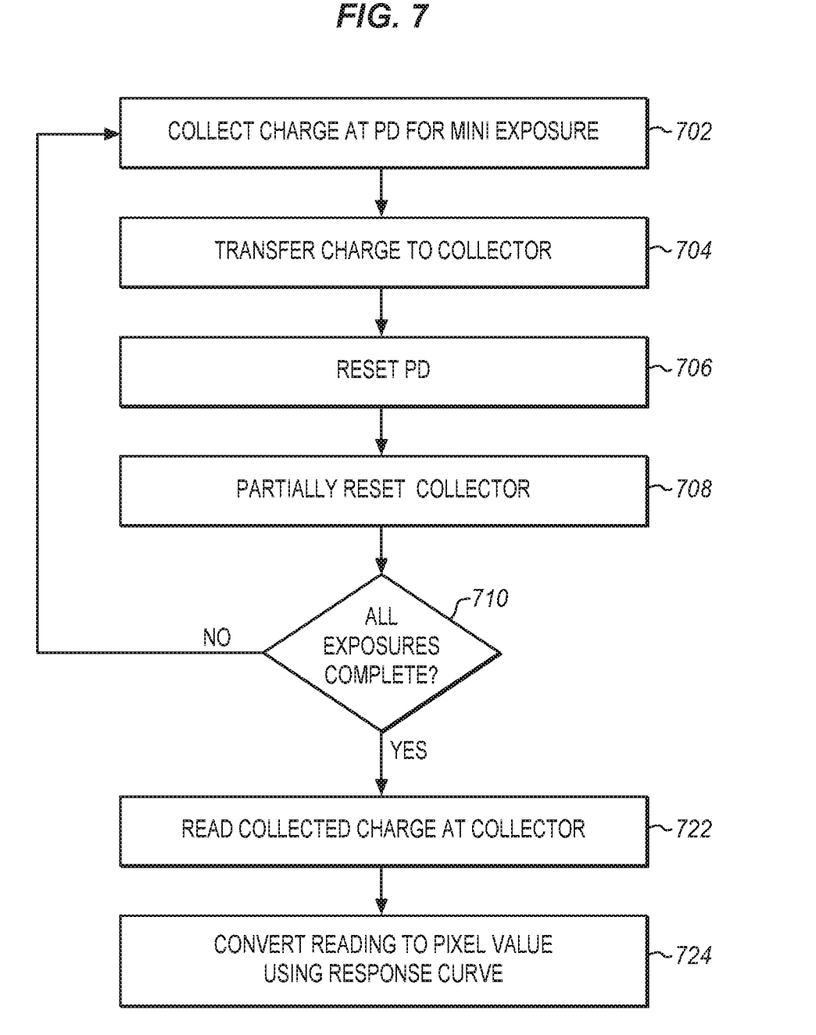
FIG. 7 is a process flow diagram of estimating pixel brightness using the modulated shutter and high dynamic range operations of FIGS. 2 and 6 according to an embodiment.

FIG. 7 is a process flow diagram of determining a pixel value with shutter modulation and high dynamic range. At 702 charge is collected at the photodetector for a first exposure. The duration of this first exposure and the subsequent exposures is selected to maximize the dynamic range and reduce noise. At the end of this exposure, at 704 the collected charge is transferred to a charge collection node. In the example of FIG. 1, there is a capacitor and charge is transferred by opening a charge transfer gate between the two devices. In the example of FIG. 2, there is no separate charge collection node and the charge is collected in a diffusion node. There may be other circuit configurations for the charge collection node, depending on the particular implementation.

At 706 after the charge is transferred, then the photodetector is reset and starts the next exposure cycle. After the charge has been collected at the charge collection node at 704, then at 708 the charge collection node is partially reset. For purposes of reducing noise, this is done near the end of the second exposure. The partial reset spills some charge through a rest gate but leaves some charge in the node. In some embodiments, all of the charge for a dark pixel is left in the node and a significant portion of the charge is spilled for a bright pixel.

At 710, additional charge is collected at the photodetector for additional mini-exposures. When there are more exposures then the process returns to 702 to collect additional charge and repeat the mini-exposure process. After any additional exposures are completed, each with a lower collector reset voltage then the process continues to 722.

When the final exposure ends at 708 then at 704 the additional charge is transferred to the collector. This ends the exposure so that at 722 collected charge may be read from the collector. This may be done directly as in FIG. 5 or through a first transfer into another node such as a diffusion node as in FIG. 1. In the example of FIG. 1, the additional storage node allows some of the noise to be cancelled because the diffusion node is first reset, then the diffusion node is read to determine the noise floor, then the charge is transferred from the capacitor and then the charge is read again. This allows the noise floor to be subtracted from the final result. There are a variety of different ways to read a charge value depending on the sources and likely amounts of noise that may be present in the storage node.

The final value is read in most sensors by the assertion of a column line and a row line. These lines are coupled to an analog to digital converter (ADC). The ADC receives a voltage on the selected line based on the accumulated charge and converts this to a number that reflects the amount of charge. There may be one or many ADCs for the sensor array depending on the particular implementation of the sensor array. The number from the ADC is converted at 724 to a pixel value using a response curve for the pixel and the partial resets. The system collects pixel values for all of the pixels of the array. As described this allows for a very high dynamic range for each pixel while still operating the system with shutter modulation. While FIGS. 2 and 6 show three mini-exposures there may be two three or more mini-exposures depending on the circuit elements and the intended use for the system.

Figure 8:
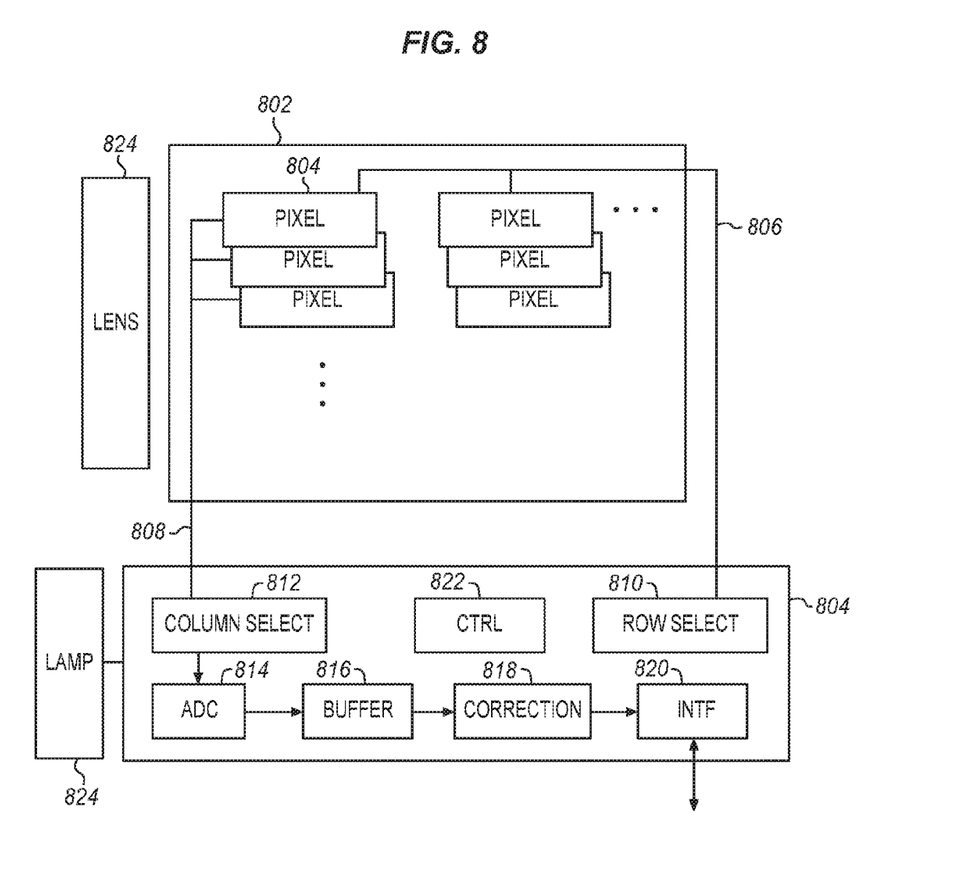
FIG. 8 is a block diagram of an image sensor with multiple photodetectors and circuits according to an embodiment.

FIG. 8 is a block diagram of an image sensor or camera system 800 that may include pixel circuits with shutter modulation and HDR as described herein. The camera 800 includes an image sensor 802 with pixels typically arranged in rows and columns. Each pixel may have a micro-lens and detector coupled to a circuit as described above. Each pixel is coupled to a row line 806 and a column line 808. These are applied to the image processor 804.

The image processor has a row selector 810 and a column selector 812. The voltage on the column line is fed to an ADC (Analog to Digital Converter) 814 which may include sample and hold circuits and other types of buffers. Alternatively, multiple ADC's may be connected to column lines in any ratio optimizing ADC speed and die area. The ADC values are fed to a buffer 816, which holds the values for each exposure to apply to a correction processor 818. This processor may compensate for any artifacts or design constraints of the image sensor or any other aspect of the system. The complete image is then compiled and rendered and may be sent to an interface 820 for transfer to external components.

The image processor 804 may be regulated by a controller 822 and contain many other sensors and components. It may perform many more operations than those mentioned or another processor may be coupled to the camera or to multiple cameras for additional processing. The controller may also be coupled to a lens system 824. The lens system serves to focus a scene onto the sensor and the controller may adjust focus distance, focal length, aperture and any other settings of the lens system, depending on the particular implementation.

The controller may also be coupled to a lamp or projector 824. This may be an LED in the visible or infrared range, a Xenon flash, or another illumination source, depending on the particular application for which the lamp is being used. The controller coordinates the lamp with the shutter modulation to achieve timing for the mini-exposures described above and for other purposes. The lamp may produce a structured, coded, or plain illumination field. There may be multiple lamps to produce different illuminations in different fields of view.

Figure 9:
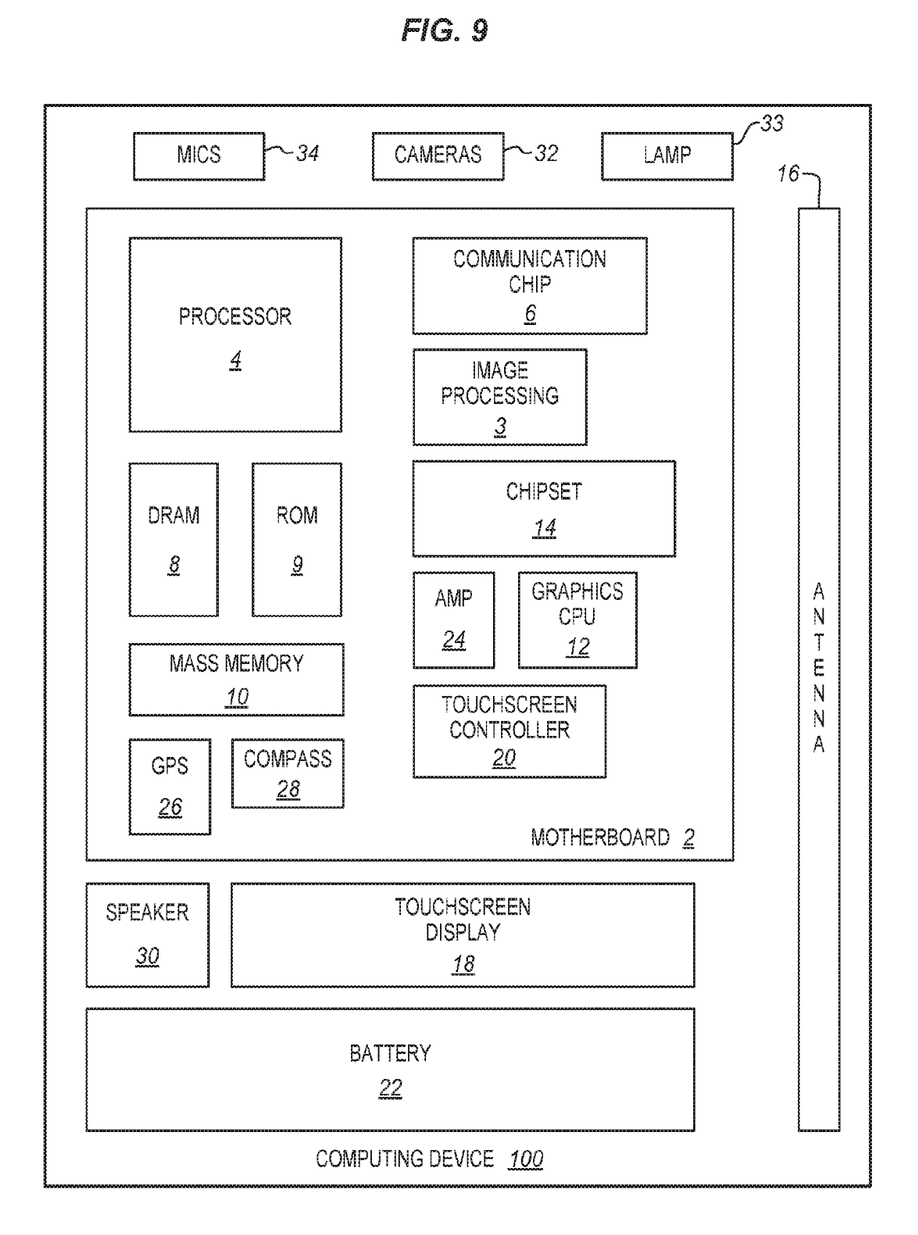
FIG. 9 is a block diagram of a computing device incorporating shutter modulation and high dynamic range according to an embodiment

FIG. 9 is a block diagram of a computing device 100 in accordance with one implementation. The computing device 100 houses a system board 2. The board 2 may include a number of components, including but not limited to a processor 4 and at least one communication package 6. The communication package is coupled to one or more antennas 16. The processor 4 is physically and electrically coupled to the board 2.

Depending on its applications, computing device 100 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, a lamp 33, a microphone array 34, and a mass storage device (such as a hard disk drive) 10, compact disk (CD) (not shown), digital versatile disk (DVD) (not shown), and so forth). These components may be connected to the system board 2, mounted to the system board, or combined with any of the other components.

The communication package 6 enables wireless and/or wired communications for the transfer of data to and from the computing device 100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication package 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 100 may include a plurality of communication packages 6. For instance, a first communication package 6 may be dedicated to shorter range wireless communications such as Wi-Fi and Bluetooth and a second communication package 6 may be dedicated to longer range wireless communications such as GPS, EDGE, GPRS, CDMA, WiMAX, LTE, Ev-DO, and others.

The cameras 32 contain image sensors with pixels or photodetectors as described herein. The image sensors may use the resources of an image processing chip 3 to read values and also to perform exposure control, shutter modulation, format conversion, coding and decoding, noise reduction and 3D mapping, etc. The processor 4 is coupled to the image processing chip to drive the processes, set parameters, etc.

In various implementations, the computing device 100 may be eyewear, a laptop, a netbook, a notebook, an ultrabook, a smartphone, a tablet, a personal digital assistant (PDA), an ultra mobile PC, a mobile phone, a desktop computer, a server, a set-top box, an entertainment control unit, a digital camera, a portable music player, or a digital video recorder. The computing device may be fixed, portable, or wearable. In further implementations, the computing device 100 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a method that includes collecting charge at a photodetector of a photodetector circuit for a first duration for a first mini-exposure. The photodetector charge is transferred to a charge collection node of the photodetector circuit. A portion of the transferred charge is spilled from the charge collection node. Charge is collected at the photodetector for a second duration for a second mini-exposure. The second mini-exposure photodetector charge is transferred to the charge collection node after spilling the portion. The collected charge is read after transferring the second mini-exposure photodetector charge and the spilled portion of the charge is estimated and the spilled portion is added to the collected charge reading to obtain a total charge value for the combined exposures.

Further embodiments include resetting the charge collection node before transferring the first mini-exposure photodetector charge.

In further embodiments spilling a portion comprises operating a reset switch coupled to the charge collection node for a controlled duration.

Further embodiments include collecting charge at the photodetector for additional durations for additional mini-exposures, transferring charge to the charge collection node for the additional mini-exposures, and spilling additional portions of the transferred charge before reading the collected charge.

In further embodiments estimating the collected charge comprises applying the read charge to a response curve of the photodetector and the mini-exposures.

In further embodiments the response curve is determined empirically.

In further embodiments spilling comprises partially resetting the charge collection node.

In further embodiments partially resetting comprises opening a reset gate coupled to the charge collection node using a pre-determined voltage and wherein the voltage is less for the second mini-exposure than for the first mini-exposure.

In further embodiments the voltages are selected to maintain charge at the charge collection node that is above a noise floor of the charge collection node.

In further embodiments the voltages are selected to not affect accumulated charge at the charge collection node for the darkest pixel values.

In further embodiments the charge collection node is a capacitor, the method further comprising resetting a diffusion node and transferring the charge from the charge collection node to the reset diffusion node and wherein reading the collected charge comprises reading the collected charge from the diffusion node.

Further embodiments include activating a lamp during collecting charge at the photodetector and deactivating the lamp when transferring the photodetector charge.

Some embodiments pertain to an apparatus that includes a photodetector of a photodetector circuit to collect charge for a first duration for a first mini-exposure and to collect charge for a second duration for a second mini-exposure, a charge collection node of the photodetector circuit to collect charge transferred from the photodetector for the first and second mini-exposures, a controller coupled to a transfer gate to spill a portion of the transferred charge from the charge collection node after the first mini-exposure, and an image processor to read the collected charge at the charge collection node after the second mini-exposure photodetector charge is transferred to the charge collection node, to estimate the spilled portion of the charge and to add the spilled portion to the collected charge reading to obtain a total charge value for the first and second mini-exposures.

Further embodiments include the controller further resetting the charge collection node before transferring the first mini-exposure photodetector charge.

In further embodiments spilling a portion comprises operating a reset switch coupled to the charge collection node for a controlled duration.

In further embodiments spilling comprises partially resetting the charge collection node by the controller opening a reset gate coupled to the charge collection node using a pre-determined voltage and wherein the voltage is less for the second mini-exposure than for the first mini-exposure.

In further embodiments the voltages are selected to maintain charge at the charge collection node that is above a noise floor of the charge collection node.

Some embodiments pertain to a system that includes a lens system, an image sensor array having a plurality of photodetector circuits to receive light through the lens system at each of the photodetector circuits, each photodetector circuit to collect charge for a first duration for a first mini-exposure and to collect charge for a second duration for a second mini-exposure, a charge collection node of each photodetector circuit to collect charge transferred from the photodetector for the first and second mini-exposures, a controller coupled to a transfer gate of each photodetector circuit to spill a portion of the transferred charge from the charge collection node after the first mini-exposure, an image processor coupled to the image sensor array to read the collected charge at the charge collection node after the second mini-exposure photodetector charge is transferred to the charge collection node, to estimate the spilled portion of the charge and to add the spilled portion to the collected charge reading to obtain a total charge value for the first and second mini-exposures, and to generate an image using the total charge value, a memory to store the generated image; and a display to render the generated image from the memory.

Further embodiments include a projector proximate the lens system to illuminate a scene, wherein the received light includes light from the projector reflected off the scene.

In further embodiments the charge collection node is a capacitor, the photodetector circuit further comprising a diffusion node and wherein the controller transfers the charge from the charge collection node to the diffusion node and wherein the image processor reads the collected charge by reading the collected charge from the diffusion node.

What is claimed is:
1. A method comprising:
 collecting charge at a photodetector of a photodetector circuit for a first duration for a first mini-exposure;
 transferring the photodetector charge to a charge collection node of the photodetector circuit;
 spilling a portion of the transferred charge from the charge collection node;
 collecting charge at the photodetector for a second duration for a second mini-exposure;

transferring the second mini-exposure photodetector charge to the charge collection node after spilling the portion;

reading the collected charge after transferring the second mini-exposure photodetector charge; and estimating the spilled portion of the charge and adding the spilled portion to the collected charge reading to obtain a total charge value for the combined exposures.

2. The method of claim 1, further comprising resetting the charge collection node before transferring the first mini-exposure photodetector charge.

3. The method of claim 1, wherein spilling a portion comprises operating a reset switch coupled to the charge collection node for a controlled duration.

4. The method of claim 1, further comprising collecting charge at the photodetector for additional durations for additional mini-exposures, transferring charge to the charge collection node for the additional mini-exposures, and spilling additional portions of the transferred charge before reading the collected charge.

5. The method of claim 1, wherein estimating the collected charge comprises applying the read charge to a response curve of the photodetector and the mini-exposures.

6. The method of claim 5, wherein the response curve is determined empirically.

7. The method of claim 1, wherein spilling comprises partially resetting the charge collection node.

8. The method of claim 7, wherein partially resetting comprises opening a reset gate coupled to the charge collection node using a pre-determined voltage and wherein the voltage is less for the second mini-exposure than for the first mini-exposure.

9. The method of claim 8, wherein the voltages are selected to maintain charge at the charge collection node that is above a noise floor of the charge collection node.

10. The method of claim 8, wherein the voltages are selected to not affect accumulated charge at the charge collection node for the darkest pixel values.

11. The method of claim 1, wherein the charge collection node is a capacitor, the method further comprising resetting a diffusion node and transferring the charge from the charge collection node to the reset diffusion node and wherein reading the collected charge comprises reading the collected charge from the diffusion node.

12. The method of claim 1, further comprising activating a lamp during collecting charge at the photodetector and deactivating the lamp when transferring the photodetector charge.

13. An apparatus comprising:
a photodetector of a photodetector circuit to collect charge for a first duration for a first mini-exposure and to collect charge for a second duration for a second mini-exposure;
a charge collection node of the photodetector circuit to collect charge transferred from the photodetector for the first and second mini-exposures;
a controller coupled to a transfer gate to spill a portion of the transferred charge from the charge collection node after the first mini-exposure; and
an image processor to read the collected charge at the charge collection node after the second mini-exposure photodetector charge is transferred to the charge collection node, to estimate the spilled portion of the charge and to add the spilled portion to the collected charge reading to obtain a total charge value for the first and second mini-exposures.

14. The apparatus of claim 13, the controller further resetting the charge collection node before transferring the first mini-exposure photodetector charge.

15. The apparatus of claim 13, wherein spilling a portion comprises operating a reset switch coupled to the charge collection node for a controlled duration.

16. The apparatus of claim 13, wherein spilling comprises partially resetting the charge collection node by the controller opening a reset gate coupled to the charge collection node using a pre-determined voltage and wherein the voltage is less for the second mini-exposure than for the first mini-exposure.

17. The apparatus of claim 16, wherein the voltages are selected to maintain charge at the charge collection node that is above a noise floor of the charge collection node.

18. A system comprising:
a lens system;
an image sensor array having a plurality of photodetector circuits to receive light through the lens system at each of the photodetector circuits, each photodetector circuit to collect charge for a first duration for a first mini-exposure and to collect charge for a second duration for a second mini-exposure;
a charge collection node of each photodetector circuit to collect charge transferred from the photodetector for the first and second mini-exposures;
a controller coupled to a transfer gate of each photodetector circuit to spill a portion of the transferred charge from the charge collection node after the first mini-exposure;
an image processor coupled to the image sensor array to read the collected charge at the charge collection node after the second mini-exposure photodetector charge is transferred to the charge collection node, to estimate the spilled portion of the charge and to add the spilled portion to the collected charge reading to obtain a total charge value for the first and second mini-exposures, and to generate an image using the total charge value;
a memory to store the generated image; and
a display to render the generated image from the memory.

19. The system of claim 18, further comprising a projector proximate the lens system to illuminate a scene, wherein the received light includes light from the projector reflected off the scene.

20. The system of claim 18, wherein the charge collection node is a capacitor, the photodetector circuit further comprising a diffusion node and wherein the controller transfers the charge from the charge collection node to the diffusion node and wherein the image processor reads the collected charge by reading the collected charge from the diffusion node.

* * * * *